(12) United States Patent
Jo et al.

(10) Patent No.: US 9,362,316 B2
(45) Date of Patent: Jun. 7, 2016

(54) DISPLAY DEVICE

(71) Applicant: LG Display Co., Ltd., Seoul (KR)

(72) Inventors: Young Jik Jo, Paju-si (KR); Chul Nam, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/576,312

(22) Filed: Dec. 19, 2014

(65) Prior Publication Data

US 2015/0187808 A1    Jul. 2, 2015

(30) Foreign Application Priority Data

Dec. 31, 2013 (KR) .................. 10-2013-0169088

(51) Int. Cl.
*H01L 27/02* (2006.01)
*H01L 27/12* (2006.01)
*G02F 1/1362* (2006.01)
*G02F 1/1345* (2006.01)
*G02F 1/1333* (2006.01)

(52) U.S. Cl.
CPC ............ *H01L 27/124* (2013.01); *G02F 1/1345* (2013.01); *G02F 1/136204* (2013.01); *G02F 1/136286* (2013.01); *G02F 2001/133388* (2013.01)

(58) Field of Classification Search
CPC ............................. H01L 27/124; H01L 27/323
USPC ............................................................ 257/48
See application file for complete search history.

(56) References Cited

U.S. PATENT DOCUMENTS

| | | | | |
|---|---|---|---|---|
| 5,091,723 A * | 2/1992 | Kanno | ................. | G09G 3/3629 345/208 |
| 5,172,107 A * | 12/1992 | Kanno | ................. | G09G 3/3629 345/100 |
| 5,443,800 A * | 8/1995 | Dunder | .................. | G05B 11/30 327/172 |
| 6,603,454 B1* | 8/2003 | Nakamura | ........... | G09G 3/3633 345/100 |
| 8,625,040 B2* | 1/2014 | Iwanami | ................ | G02F 1/1345 349/43 |
| 2006/0146247 A1* | 7/2006 | Kim | .................. | G02F 1/134363 349/141 |
| 2008/0251787 A1* | 10/2008 | Kim | ........................ | H01L 22/32 257/48 |
| 2010/0277425 A1* | 11/2010 | Choi | ...................... | G06F 3/0412 345/173 |
| 2011/0134105 A1* | 6/2011 | Nakata | .................. | G09G 3/2927 345/212 |
| 2012/0194495 A1* | 8/2012 | Kadowaki | ........... | G02B 27/2214 345/208 |
| 2012/0200506 A1* | 8/2012 | Taylor | ..................... | H05K 1/189 345/173 |
| 2013/0168215 A1* | 7/2013 | Xie | ......................... | G06F 3/041 200/5 R |
| 2014/0125571 A1* | 5/2014 | Um | ........................ | G09G 3/3614 345/88 |
| 2014/0320765 A1* | 10/2014 | Jiang | ....................... | G06F 3/041 349/12 |

* cited by examiner

*Primary Examiner* — Michael Lebentritt
(74) *Attorney, Agent, or Firm* — Birch, Stewart, Kolasch & Birch, LLP

(57) ABSTRACT

Disclosed is a display device which includes: a plurality of gate lines arranged in a first direction; a plurality of data lines arranged in a second direction crossing the first direction; a plurality of jumping electrodes each disposed a first edge portion of each of the data lines; and a plurality of shield portions disposed between the jumping electrodes. Such a display device allows the shield portions to be disposed between the jumping electrodes. As such, the display device can prevent a light leak phenomenon due to an electric field which is generated by the shortened distance between the front edge portions of the data lines.

16 Claims, 3 Drawing Sheets

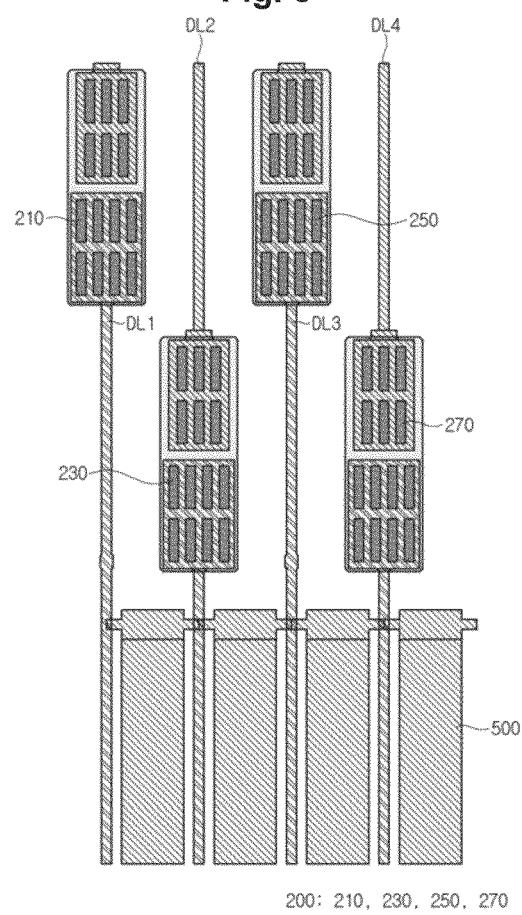

DISPLAY DEVICE

CROSS-REFERENCE TO RELATED APPLICATION

The present application claims priority to and the benefit under 35 U.S.C. §119(a) of Korean Patent Application No. 10-2013-0169088 filed on Dec. 31, 2013, which is hereby incorporated by reference for all purposes as if fully set forth herein.

BACKGROUND OF THE INVENTION

1. Field of the Disclosure

The present application relates to a display device. More particularly, the present application relates to a display device adapted to prevent a light leak.

2. Description of the Related Art

Recently, flat panel display devices which can be used instead of cathode ray tubes (CRTs) are being rapidly developed. The flat panel display devices include liquid crystal display (LCD) devices, plasma display panels (PDPs), organic light emitting display (OLED) device and so on.

Among the flat panel display devices, the LCD device has features of thinner structure, lighter weight, lower power consumption and lower driving voltage compared to the other flat panel display devices. As such, the LCD device is being mainly applied to a variety of appliances.

An ordinary LCD device includes a liquid crystal panel for displaying images and a backlight unit for applying light to the liquid crystal panel. Also, the ordinary LCD device includes a guide panel disposed between the liquid crystal panel and the backlight unit. The guide panel maintains a gap between the liquid crystal panel and the backlight unit.

Such an LCD device is being designed in order to realize a high definition image. As such, the number of data lines must increases. To this end, the distance between the data lines must become shorter. The shortened distance between the data lines can cause a light leak phenomenon by an electric field being generated between the data lines.

SUMMARY OF THE INVETION

Accordingly, embodiments of the present application are directed to a display device that substantially obviates one or more of problems due to the limitations and disadvantages of the related art.

The embodiments are to provide a display device which is adapted to prevent the generation of a light leak phenomenon in the front edge portion of a data line.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment, a display device includes: a plurality of gate lines arranged in a first direction; a plurality of data lines arranged in a second direction crossing the first direction; a plurality of jumping electrode each disposed a front portion of the respective data line; and a plurality of shield portions disposed between the jumping electrodes.

A display device according to another general aspect of the present embodiment includes: a plurality of gate lines arranged in a first direction; a plurality of data lines arranged in a second direction crossing the first direction; and a plurality of jumping electrodes each disposed a front portion of the respective data lines. The jumping electrodes are arranged without overlapping another jumping electrode on the data lines adjacent thereto in a lateral direction.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 5 is a planar view showing a display device according to a fourth embodiment of the present disclosure.

DETAILED DESCRIPTION OF THE ILLUSTRATED EMBODIMENTS

Figure 1:
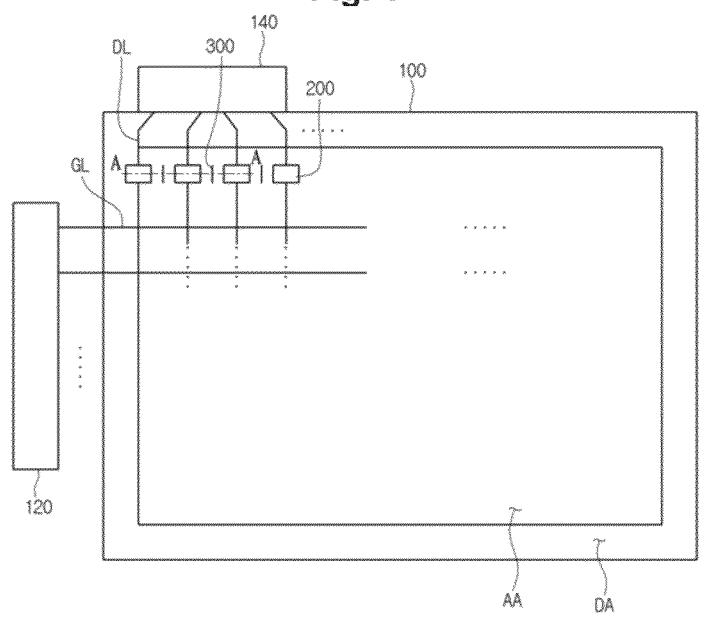
FIG. 1 is a layout showing a display device according to a first embodiment of the present disclosure.

Reference will now be made in detail to embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 2:
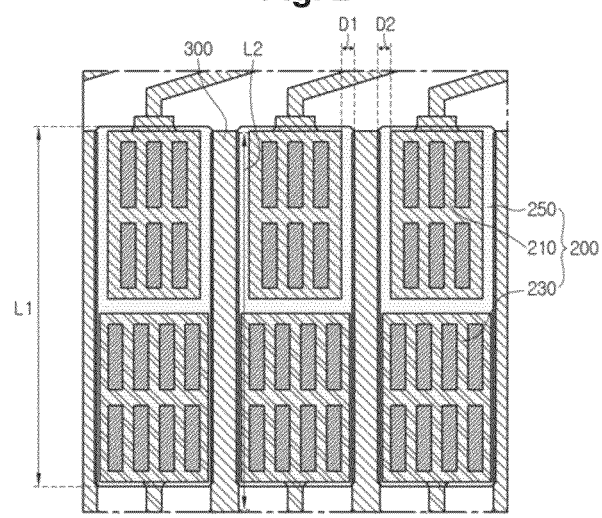
FIG. 2 is a planar view enlarging portion A in FIG. 1.

FIG. 1 is a layout showing a display device according to a first embodiment of the present disclosure. FIG. 2 is a planar view enlarging portion A in FIG. 1.

Referring to FIG. 1, a display device according to a first embodiment of the present disclosure includes a liquid crystal panel 100, a gate driver 120 and a data driver 140. The liquid crystal panel 100 includes: a plurality of gate lines GL arranged in a first direction; a plurality of data lines DL arranged in a second direction perpendicular to the first direction; a plurality of jumping electrodes 200 each disposed at the front portion of the data line DL; and a plurality of shield portions 300 arranged between the jumping electrodes 200.

The liquid crystal panel 100 can be defined into a display area AA for displaying images and a non-display area DA surrounding the display area AA. A plurality of pixels can be arranged on the display area AA. The plurality of pixels can be arranged in a matrix shape. The pixels can be disposed in respective pixel regions. The pixel regions can be defined by the plurality of gate lines GL, which is arranged in the first direction, and the plurality of data lines DL which is arranged in the second direction perpendicularly crossing the first direction.

Each of the pixels can include a thin film transistor, a liquid crystal cell and a storage capacitor. The liquid crystal cell can be driven by an electric field which is generated by a difference between a data voltage, which is applied to a pixel electrode through the thin film transistor, and a common voltage applied to a common electrode. The storage capacitor is used to maintain the data voltage, which is applied to the pixel electrode, during a fixed period.

The gate driver 120 can sequentially apply scan signals to the plurality of gate lines GL. The scan signal is a pulse signal selectively having a gate-on voltage and a gate-off voltage. The gate-on voltage is used for turning-on the thin film transistor which is included in the pixel region. The gate-off voltage is used for turning-off the thin film transistor.

The data driver 140 can be used to convert image data applied from the exterior into data voltages using reference gamma voltages. The converted data voltages are applied to the plurality of data lines DL. Such a data driver 140 can be configured with a single driving IC (integrated circuit) chip or a plurality of driving IC chips.

Each of the jumping electrodes 200 can be disposed at the front edge portion of each of the data lines DL. The jumping electrode 200 can include a gate electrode material pattern (or pattern-for-gate) 210, a data electrode material pattern (or a pattern-for-data) 230 and a connection pattern 250, as shown in FIG. 2. The gate electrode material pattern 210 and the data electrode material pattern 230 are formed with having a gate insulation film therebetween. The data electrode material pattern 230 can partially overlap with the gate electrode material pattern 210. The connection pattern 250 can be connected to the gate electrode material pattern 210 and the data electrode material pattern 230 through first and second contact holes. The first contact hole penetrates through a passivation film and the gate insulation film and exposes the gate electrode material pattern 210. The second contact hole penetrates the passivation film and exposes the data electrode material pattern 230. The connection pattern 250 can be formed of an opaque conductive material or a transparent conductive material.

The shield portions 300 can be arranged between the jumping electrodes 200. The shield portions 300 are used to shield a light leak phenomenon which can be generated between the jumping electrodes 200. Also, the shield portions 300 can be formed of a metal material. Each of the shield portions 300 can be formed in a long bar shape. Moreover, the shield portions 300 can be arranged parallel to the data lines DL. Furthermore, the shield portions 300 can be disposed on the same layer as the jumping electrode 200.

The length L2 of the shield portion 300 can correspond to (e.g., can be the same as) the length L1 of the jumping electrode 200. Alternatively, the shield portion 300 can be formed longer than the length L1 of the jumping electrode 200. Also, the shield portion 300 can be disposed at a higher vertical position than the upper edge of the jumping electrode 200. Also, the shield portion 300 can be disposed at a vertical position lower than the lower edge of the jumping electrode 200.

A first distance D1 between one of the shield portions 300 and a jumping electrode 200 adjacent to the left side of the shield portion 300 can correspond to a second distance D2 between the shield portion 300 and another jumping electrode 200 adjacent to the right side of the shield portions 300. Alternatively, the first distance D1 between one of the shield portions 300 and a jumping electrode 200 adjacent to the left side of the shield portion 300 can be larger than the second distance D2 between the shield portion 300 and another jumping electrode 200 adjacent to the right side of the shield portions 300. In another different manner, the first distance D1 between one of the shield portions 300 and a jumping electrode 200 adjacent to the left side of the shield portion 300 can become smaller than the second distance D2 between the shield portion 300 and another jumping electrode 200 adjacent to the right side of the shield portions 300.

The shield portion 300 can be formed in such a manner as to overlap with a part of the connection pattern 250 when viewed in the direction from the screen of the LCD panel. The shield portion 300 can be disposed with overlapping a part of a connection pattern 250 adjacent to its right side. Also, the shield portion 300 can be disposed with overlapping a part of another connection pattern 250 adjacent to its left side.

Although a single shield portion 300 is disposed between the jumping electrodes 200, the present disclosure is not limited to this. Alternatively, at least two shield portions 300 can be disposed between the jumping electrodes 200.

In this manner, the display device according to a first embodiment of the present disclosure allows the shield portions to be disposed between the jumping electrodes. As such, the display device can prevent a light leak phenomenon due to an electric field which is generated by the shortened distance between the front portions of the data lines.

Figure 3:
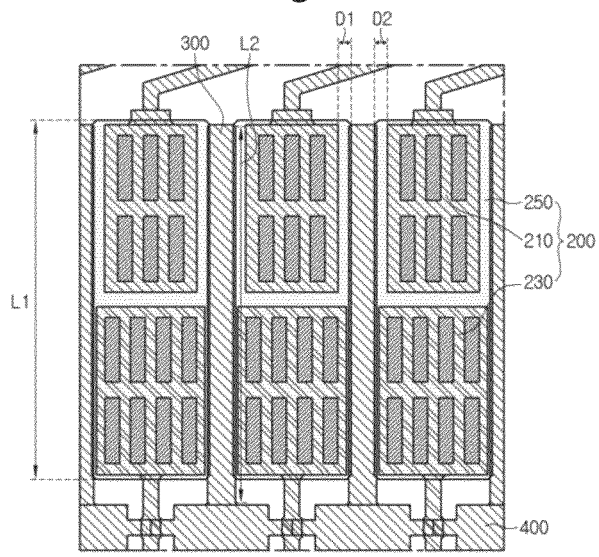
FIG. 3 is a planar view showing a display device according to a second embodiment of the present disclosure.

FIG. 3 is a planar view showing a display device according to a second embodiment of the present disclosure. As shown in FIG. 3, a display device according to a second embodiment of the present disclosure can include: a plurality of gate lines GL arranged in a first direction; a plurality of data lines DL arranged in a second direction perpendicular to the first direction; a plurality of jumping electrodes 200 each disposed at the front portion of the data line DL; a plurality of shield portions 300 arranged between the jumping electrodes 200; and a ground line 400 disposed adjacently to lower edges of the shield portions 300 and connected with the plurality of shield portions 300. The display device of the second embodiment has the same configuration as that of the first embodiment with the exception of the shield portions 300 and the ground line 400. As such, the description of the second embodiment overlapping with the first embodiment will be omitted.

The shield portions 300 can be arranged between the jumping electrodes 200. Also, the shield portions 300 can be formed of a metal material. Each of the shield portions 300 can be formed in a long bar shape. Moreover, the shield portions 300 can be arranged parallel to the data lines DL. Furthermore, the shield portions 300 can be disposed on the same layer as the jumping electrode 200.

A first distance D1 between one of the shield portions 300 and a jumping electrode 200 adjacent to the left side of the shield portion 300 can correspond to a second distance D2 between the shield portion 300 and another jumping electrode 200 adjacent to the right side of the shield portions 300.

The shield portion 300 can be formed to have a longer length L2 than the length L1 of the jumping electrode 200. Also, the shield portion 300 can be disposed at a vertical position lower than a lower edge of the jumping electrode 200. Also, the shield portion 300 can be disposed at the same vertical position as the upper edge of the jumping electrode 200.

The ground line 400 can be disposed under the lower edges of the shield portions 300. Also, the ground line 400 can be disposed in a perpendicular direction to the shield portion 300 and the same direction as the gate line GL. Moreover, the ground line 400 can be connected with the plurality of shield portions 300. Furthermore, both ends of the ground line 400 can be grounded to a ground voltage source.

As described above, although the ground line 400 is formed in a long bar shape and connected to the plurality of shield portions 300, the present disclosure is not limited to this. In other words, the ground line 400 can be formed in the same number as the shield portions.

Figure 4:
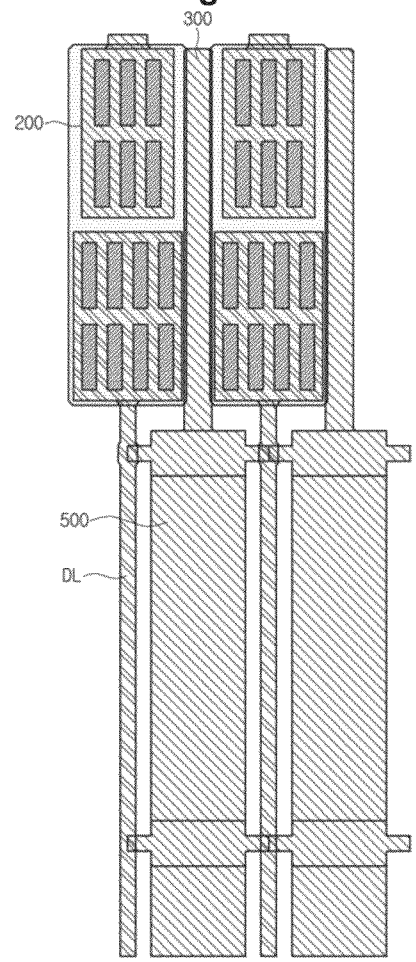
FIG. 4 is a planar view showing a display device according to a third embodiment of the present disclosure.

FIG. 4 is a planar view showing a display device according to a third embodiment of the present disclosure. Referring to FIG. 4, a display device according to a third embodiment of the present disclosure can include: a plurality of gate lines GL arranged in a first direction; a plurality of data lines DL arranged in a second direction crossing the first direction; a plurality of jumping electrodes 200 each disposed at the front portion of the data line DL; a plurality of shield portions 300 arranged between the jumping electrodes 200; and a plurality of anti-static circuits 500 arranged under lower edges of the shield portions 300 and connected the respective shield portions 300. The display device of the third embodiment has the same configuration as that of the first embodiment with the exception of the shield portions 300 and the anti-static circuits 500. As such, the description of the third embodiment overlapping with the first embodiment will be omitted.

The shield portions 300 can be arranged between the jumping electrodes 200. Also, the shield portions 300 can be formed of a metal material. Each of the shield portions 300 can be formed in a long bar shape. Moreover, the shield portions 300 can be arranged parallel to the data lines DL. Furthermore, the shield portions 300 can be disposed on the same layer as the jumping electrode 200.

A first distance Di between one of the shield portions 300 and a jumping electrode 200 adjacent to the left side of the shield portion 300 can correspond to a second distance D2 between the shield portion 300 and another jumping electrode 200 adjacent to the right side of the shield portions 300. The length L2 can be formed longer than the length L1 of the jumping electrode 200. Also, the shield portion 300 can be disposed at a vertical position lower than the lower edge of the jumping electrode 200. Moreover, the shield portion 300 can be disposed at the same vertical position as the upper edge of the jumping electrode 200.

The anti-static circuits 500 arranged under the lower edges of the shield portions 300 can be connected to the respective shield portions 300. The anti-static circuit 500 is used to prevent damage of the data line DL which can be caused by an electrostatic shock. The anti-static circuits 500 can be arranged in the same number as the data lines DL. As such, the shield portions can be formed in a structure of extending from the upper edges of the respective anti-static circuits 500 in an outward direction. The shield portions 300 can be grounded in a ground voltage source through the respective anti-static circuits 500.

In this way, the display device according to a third embodiment of the present disclosure allows the shield portion to be formed in the structure of extending from the anti-static circuit. As such, damage of the display device due to static electricity can be prevented.

FIG. 5 is a planar view showing a display device according to a fourth embodiment of the present disclosure. As shown in FIG. 5, a display device according to a fourth embodiment of the present disclosure can include: a plurality of gate lines GL arranged in a first direction; a plurality of data lines DL arranged in a second direction perpendicular to the first direction; a plurality of jumping electrodes 200 each disposed at the front portion of the data line DL. The jumping electrodes 200 can be arranged without overlapping adjacent jumping electrodes 200 in the lateral direction. The display device of the fourth embodiment has the same configuration as that of the first embodiment with the exception of a layout structure of the jumping electrodes 200. As such, the description of the fourth embodiment that is common with the first embodiment will be omitted.

The jumping electrodes 200 arranged in the front edge portions of the data lines DL can include first through fourth jumping electrodes 210, 230, 250 and 270. The first jumping electrode 210 is disposed in the front edge portion of the first data line DL1. The second jumping electrode 230 is disposed in the front edge portion of the second data line DL2. The third jumping electrode 250 is disposed in the front edge portion of the third data line DL3. The fourth jumping electrode 270 is disposed in the front edge portion of the fourth data line DL4.

The first jumping electrode 210 can be disposed without overlapping the second jumping electrode 230 in the lateral direction. Also, the lower edge of the first jumping electrode 210 can be disposed at a higher vertical position than the upper edge of the second jumping electrode 230.

The second jumping electrode 230 can be disposed without overlapping the third jumping electrode 250 in the lateral direction. Also, the second jumping electrode 230 can be disposed without overlapping the first jumping electrode 210 in the lateral direction.

The third jumping electrode 250 can be disposed in such a manner as to face the first jumping electrode 210 in a lateral direction. Also, the third jumping electrode 250 can be formed in the same length as the first jumping electrode 210. In detail, the upper edge of the third electrode 250 can be disposed at the same vertical level as that of the first jumping electrode 210. The lower edge of the third electrode 250 can be disposed at the same vertical level as that of the first jumping electrode 210.

The upper edge of the fourth jumping electrode 270 can be disposed at the same vertical level as that of the second jumping electrode 230. Also, the fourth jumping electrode 270 can be formed in the same length as the second jumping electrode 230. As such, the lower edge of the fourth electrode 270 can be disposed at the same vertical level as that of the second jumping electrode 230.

Although not only the first jumping electrode 210 is disposed with facing the third jumping electrode 250 in the lateral direction, but also the second jumping electrode 230 is disposed with facing the fourth jumping electrode 270 in the lateral direction, the present disclosure is not limited to this. Alternatively, the first jumping electrode 210, the second jumping electrode 230, the third jumping electrode 250 and the fourth jumping electrode 270 can be arranged without overlapping one another in the lateral direction.

In this manner, the jumping electrodes are disposed without overlapping other adjacent jumping electrodes in the lateral direction. In accordance therewith, the reduction of the distance between the data lines (in particular, between the frond edge portions of the data lines) can be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. A display device comprising:
a plurality of gate lines arranged in a first direction;
a plurality of data lines arranged in a second direction crossing the first direction;
a plurality of jumping electrodes each disposed at a first edge portion of each of the data lines; and
a plurality of shield portions disposed between the jumping electrodes.

2. The display device of claim 1, wherein the shield portions extend in parallel to the data lines and are formed to have the same length as the jumping electrodes.

3. The display device of claim 1, wherein the shield portions are formed in the same length as the jumping electrodes.

4. The display device of claim 1, wherein the shield portions are formed longer than the jumping electrodes.

5. The display device of claim 4, wherein upper edges of the shield portions are disposed at vertical positions higher than those of the jumping electrodes.

6. The display device of claim 4, wherein lower edges of the shield portions are disposed at vertical positions higher than those of the jumping electrodes.

7. The display device of claim 1, further comprising a ground line which is disposed under lower edges of the shield portions and connected to the shield portions.

8. The display device of claim 7, wherein the ground line is disposed in parallel to the gate lines.

9. The display device of claim 1, further comprising a plurality of anti-static circuits arranged on the data lines, wherein the shield portions each extend from an upper end of the anti-static circuit in an outward direction.

10. The display device of claim 1, wherein the shield portions are disposed with partially overlapping a connection pattern which is included in the jumping electrodes.

11. The display device of claim 1, wherein the jumping electrodes and the shield portions are formed on a same layer.

12. A display device comprising:
a plurality of gate lines arranged in a first direction;
a plurality of data lines arranged in a second direction crossing the first direction; and
a plurality of jumping electrodes each disposed at a first edge portion of each of the data lines,
wherein the jumping electrodes are arranged without overlapping with other adjacent jumping electrodes in a lateral direction.

13. The display device of claim 12, wherein the jumping electrodes are arranged with overlapping another jumping electrode that is not adjacent thereto in the lateral direction.

14. The display device of claim 12, further comprising a ground line which is disposed under lower edges of the shield portions and connected to the shield portions.

15. The display device of claim 14, wherein the ground line is disposed in parallel to the gate lines.

16. The display device of claim 12, further comprising a plurality of anti-static circuits arranged on the data lines, wherein the shield portions each extend from an upper end of the anti-static circuit in an outward direction.

* * * * *